(12) United States Patent
Kim (10) Patent No.: US 6,818,982 B2
(45) Date of Patent: Nov. 16, 2004

(54) HEAT DISSIPATION TYPE SEMICONDUCTOR PACKAGE AND METHOD OF FABRICATING THE SAME

(76) Inventor: Young Sun Kim, 101-903 Chungkye Byucksan APT., 258 Hawangsipri-dong, Seungdong-gu, Seoul (KR)

( * ) Notice: Subject to any disclaimer, the term of this patent is extended or adjusted under 35 U.S.C. 154(b) by 337 days.

(21) Appl. No.: 10/031,853
(22) PCT Filed: Dec. 8, 2001
(86) PCT No.: PCT/KR01/02130

§ 371 (c)(1),
(2), (4) Date: Jan. 24, 2002

(87) PCT Pub. No.: WO02/061830

PCT Pub. Date: Aug. 8, 2002

(65) Prior Publication Data

US 2002/0190397 A1 Dec. 19, 2002

(30) Foreign Application Priority Data

Jan. 31, 2001  (KR) .......................................... 2001-4711

(51) Int. Cl.[7] .............................................. H01L 23/10
(52) U.S. Cl. ...................... 257/707; 257/706; 257/719; 438/122; 438/123
(58) Field of Search ................................ 257/706–707, 257/719; 438/122–123

(56) References Cited

U.S. PATENT DOCUMENTS 6,552,428 B1 * 4/2003 Huang et al. ................ 257/706

* cited by examiner

*Primary Examiner*—Luan Thai
(74) *Attorney, Agent, or Firm*—Burns, Doane, Swecker & Mathis, L.L.P.

(57) ABSTRACT

The present invention relates to a heat dissipation type semiconductor package with a heat-radiating canopy molded thereon and a method of fabricating the same. According to the present invention, there is provided a heat dissipation type semiconductor package including a die paddle, a semiconductor chip mounted on the die paddle, and a lead frame. The heat dissipation type semiconductor package is characterized by comprising wires for electrically connecting bond pads formed on the semiconductor chip and inner leads in the lead frame; a heat-radiating canopy bonded on a top surface of the semiconductor chip; and a molding material for surrounding all of the die paddle, the semiconductor chip, the inner leads and a bottom surface of the heat-radiating canopy. The top surface of the heat-radiating canopy is exposed to the exterior, and a portion of the surface of the heat-radiating canopy, which is in contact with the semiconductor chip, is recessed.

51 Claims, 4 Drawing Sheets

HEAT DISSIPATION TYPE SEMICONDUCTOR PACKAGE AND METHOD OF FABRICATING THE SAME

TECHNICAL FIELD

The present invention relates to a semiconductor package that is most widely used to package semiconductor chips, and more particularly, to a semiconductor package by which an improved heat dissipation efficiency required due to an increase in the power consumption of a semiconductor chip can be obtained, the speed of a high frequency semiconductor chip can be increased, and improvement of the characteristics and stability of the qualities of semiconductor chips used in RF products can be achieved.

BACKGROUND ART

In general, a semiconductor package is formed by providing a semiconductor chip such as a single device, an integrated circuit device, and a hybrid circuit device, in which various electronic circuits are formed and electric wiring is made, with terminals constructed by a lead frame or the like for transmitting signals to a main board, and by subsequently molding the semiconductor chip in molding materials or the like, in order to protect the semiconductor chip from various external environments including dust, moisture, and electrical and mechanical loads and to optimize and maximize the performance of the semiconductor chip. At this time, the lead frame means a structure that serves as leads for connecting input/output pads on the semiconductor chip and electrical circuits formed in the main board, as well as a support for fixing the semiconductor package to the main board.

Packages for packaging the semiconductor chip can be classified into those of using plastic material and those of using ceramic material.

Figure 1:
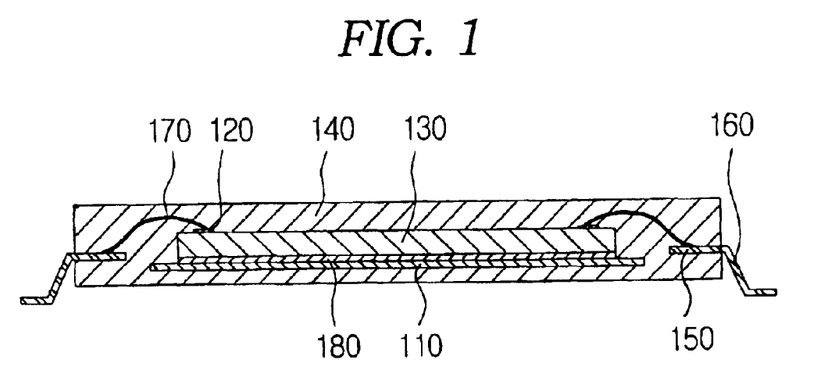
FIG. 1 illustrates an internal structure of a conventional semiconductor package using plastic material.

FIG. 1 illustrates an internal structure of a conventional semiconductor package using plastic material. A process of fabricating the semiconductor package shown in FIG. 1 will be described below:

(1) In a semiconductor chip attaching step, a semiconductor chip 130 is attached to a die paddle 110 of a lead frame by means of an adhesive 180;

(2) In a wiring step, bond pads 120 on the semiconductor chip 130 and inner leads 150 of the lead frame are connected by fine gold wires 170;

(3) In a molding step, the semiconductor chip 130 and the fine gold wires 170 are overmolded with an epoxy molding compound 140 in order to protect them; and (4) In a lead forming step, outer I/O terminals 160 of a semiconductor package obtained after completion of the molding step are trimmed and formed to form out leads.

Figure 2:
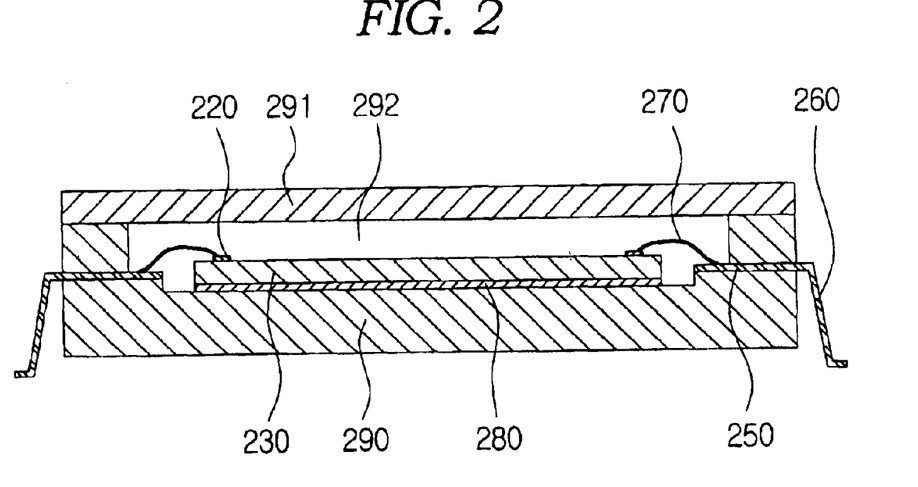
FIG. 2 illustrates an internal structure of a conventional semiconductor package using a conventional ceramic material.

FIG. 2 illustrates an internal structure of a conventional semiconductor package using ceramic material. A process of fabricating the semiconductor package shown in FIG. 2 will be described below:

(1) In a semiconductor chip attaching step, a semiconductor chip 230 is attached to a ceramic body 290 having a cavity 292 by means of an adhesive 280;

(2) In a wiring step, bond pads 220 on the semiconductor chip 230 and inner leads 250 of the ceramic body 290 are connected by fine gold wires 270; and (3) In a sealing step, the cavity of the ceramic body is sealed with a metallic lid 291 in order to protect the semiconductor chip 230 and the fine gold wires 270.

Figure 3:
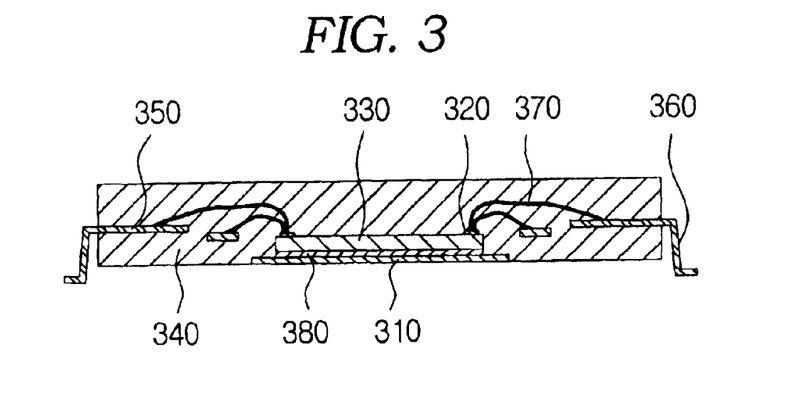
FIG. 3 shows a conventional semiconductor package in which the internal structure is modified in order to increase the heat dissipation efficiency of the semiconductor package using plastic material.

FIG. 3 shows a conventional semiconductor package in which the internal structure is modified in order to improve the heat dissipation efficiency of the semiconductor package using plastic material as shown in FIG. 1. A process of fabricating the semiconductor package shown in FIG. 3 will be described below:

(1) In a down-set step, a die paddle 310 of a lead frame is deeply downset;

(2) In a semiconductor chip attaching step, a semiconductor chip 330 is attached to the die paddle 310 by means of an adhesive 380;

(3) In a wiring step, bond pads 320 on the semiconductor chip 330 and inner leads 350 of the lead frame are connected by fine gold wires 370;

(4) In a molding step, the semiconductor chip 330 and the fine gold wires 370 are overmolded with an epoxy molding compound 340 in order to protect them; and (5) In an out lead forming step, outer I/O terminals 360 of a semiconductor package obtained after completion of the molding step are trimmed and formed to form the out leads.

Figure 4:
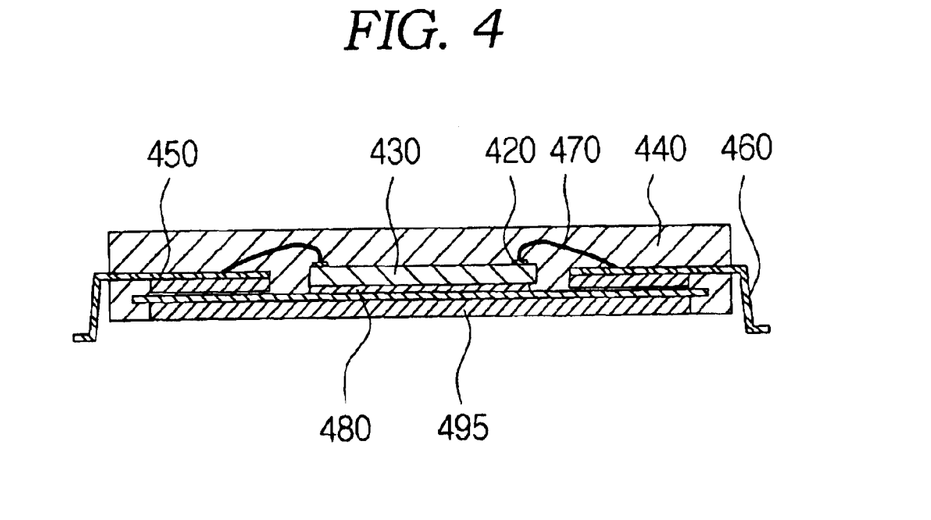
FIG. 4 shows another conventional semiconductor package of which an internal structure is modified in order to increase the heat dissipation effect in the semiconductor package using the plastic material.

FIG. 4 shows another conventional semiconductor package in which the internal structure is modified in order to improve the heat dissipation efficiency of the semiconductor package using plastic material. A process of fabricating the semiconductor package shown in FIG. 4 will be described below:

(1) In a heat slug forming step, an additional heat slug 495 instead of a die paddle of a lead frame is attached to the lead frame;

(2) In a semiconductor chip attaching step, a semiconductor chip 430 is attached to the heat slug 495 in the lead frame by means of an adhesive 480;

(3) In a wiring step, bond pads 420 on the semiconductor chip 430 and inner leads 450 of the lead frame are connected by fine gold wires 470;

(4) In a molding step, the semiconductor chip 430 and the fine gold wires 470 are overmolded with an epoxy molding compound 440 in order to protect them; and (5) In an out lead forming step, outer I/O terminals 460 of a semiconductor package obtained after completion of the molding step are trimmed and formed to form the out leads.

However, in a case where these conventional semiconductor packages are used to package a semiconductor chip having high power consumption, there is a problem in that heat generated in the semiconductor chip cannot be efficiently dissipated to the exterior thereof.

Further, in a case where the die paddle to which the semiconductor chip is attached is exposed or the heat slug attached to serve the function of the die paddle is exposed, the package is repeatedly expanded and contracted due to the heat generated from the semiconductor chip, which causes warpage of the package due to unbalance of upper and lower structures of the material constructing the package. Accordingly, there is a problem that minute delamination is formed between the exposed die paddle or heat slug and the molding material, the reliability of package is deteriorated in the long run due to infiltration of moisture and the like.

DISCLOSURE OF INVENTION

The present invention is conceived to solve the aforementioned problems in the prior art. An object of the present invention is to provide a semiconductor package with a heat-radiating canopy molded thereon and a method of fabricating the same, by which efficient heat dissipation required due to an increase in the power consumption of a semiconductor chip can be obtained, a smooth operation thereof can be made in a high frequency band to increase the speed of the semiconductor chip, and improvement of the characteristics and stability of the qualities of semiconductor chips used in RF products can be achieved.

According to the present invention, there is provided a heat dissipation type semiconductor package including a die paddle, a semiconductor chip mounted on the die paddle and a lead frame, comprising: a plurality of wires electrically connecting bond pads formed on the semiconductor chip and inner leads in the lead frame; a heat-radiating canopy attached to a top surface of the semiconductor chip; and a molding material surrounding all of the die paddle, the semiconductor chip, the inner leads and a bottom surface of the heat-radiating canopy; wherein the top surface of the heat-radiating canopy is is exposed to the exterior, and a portion of the bottom surface of the heat-radiating canopy being in contact with the semiconductor chip is recessed.

According to the present invention, there is also provided a heat dissipation type semiconductor package including a substrate, a die paddle formed on the substrate, a semiconductor chip mounted on the die paddle, and inner leads attached to the substrate and serving as electrical contacts, comprising: a plurality of wires electrically connecting bond pads formed on the semiconductor chip and the inner leads; a heat-radiating canopy attached to a top surface of the semiconductor chip; a molding material surrounding all of the die paddle, the semiconductor chip, the inner lead and a bottom surface of the heat-radiating canopy; and solder balls mounted on a bottom surface of the substrate and serving as electrical inputs/outputs; wherein the top surface of the heat-radiating canopy is exposed to the exterior, and a portion of the surface of the heat-radiating canopy being in contact with the semiconductor chip is recessed.

According to the present invention, there is also provided a method of fabricating a heat dissipation type semiconductor package, comprising the steps of: attaching a semiconductor chip to a die paddle of a lead frame of a semiconductor package; connecting bond pads on the semiconductor chip and inner leads in the lead frame by means of wires; attaching a heat-radiating canopy to a top surface of the semiconductor chip; performing a molding in such a manner that a top surface of the heat-radiating canopy is exposed to the exterior; and trimming and forming out leads in the semiconductor package obtained after completion of the molding so as to form I/O terminals of the semiconductor package.

According to the present invention, there is also provided a method of fabricating a heat dissipation type semiconductor package, comprising the steps of: forming a die paddle and inner leads on a substrate; attaching a semiconductor chip to the die paddle; connecting bond pads on the semiconductor chip and the inner leads by means of wires; attaching a heat-radiating canopy to a top surface of the semiconductor chip by means of an adhesive; performing a molding in such a manner that a top surface of the heat-radiating canopy is exposed to the exterior; and forming solder balls on a bottom surface of the semiconductor package after completion of the molding step.

More preferably, the semiconductor chip attaching step comprises a step of attaching the semiconductor chip by means of an adhesive and then curing the adhesive using an electric oven or a heater block.

More preferably, the wires are made of any one of gold, copper, aluminum, and an arbitrary combination thereof.

More preferably, a central portion of the heat-radiating canopy is recessed so that a portion of the beat-radiating canopy, which is located above the top surface of the semiconductor chip, is in contact with the semiconductor chip and the remaining portions of the heat-radiating canopy are not in contact with the semiconductor chip.

More preferably, when the heat-radiating canopy is attached to the top surface of the semiconductor chip, the heat-radiating canopy is caused to be in contact with an active area of the semiconductor chip.

More preferably, the heat-radiating canopy is made of a material selected from a group consisting of thermal conductive materials, electrically conductive materials and an arbitrary combination thereof.

More preferably, the heat-radiating canopy has a round shape or a polygonal shape depending on the shape of the semiconductor package.

More preferably, an edge of the heat-radiating canopy is curved toward a bottom surface of the semiconductor package.

More preferably, an edge of the heat-radiating canopy is formed with a portion protruding toward a bottom surface of the semiconductor package.

More preferably, the heat-radiating canopy attaching step comprises a step of attaching the heat-radiating canopy to the top surface of the semiconductor chip by means of an adhesive and then curing the adhesive using an electric oven or a heater block.

More preferably, the adhesive is selected from a group consisting of thermo-plastic adhesive epoxy, thermo-set adhesive epoxy, thermal conductive epoxy, electrically conductive epoxy, an adhesive tape, and an arbitrary combination thereof.

More preferably, a plurality of projections are formed on the exposed surface of the heat-radiating canopy.

More preferably, an external heat slug is attached to the exposed surface of the heat-radiating canopy.

More preferably, a post-mold curing process is performed by using an electric oven, after the molding step.

More preferably, the exposed surface of the heat-radiating canopy is polished or defleshed.

More preferably, the out leads or the exposed surface of the heat-radiating canopy are plated.

BEST MODE FOR CARRYING OUT THE INVENTION

Hereinafter, a heat dissipation type semiconductor package and a method of fabricating the same according to preferred embodiments of the present invention will be explained in detail with reference to the accompanying drawings.

FIGS. 5a to 5e are views schematically showing a semiconductor package with a heat-radiating canopy molded thereon and a method of fabricating the same according to a preferred embodiment of the present invention. A detailed description thereof will be made below.

Figure 5A:
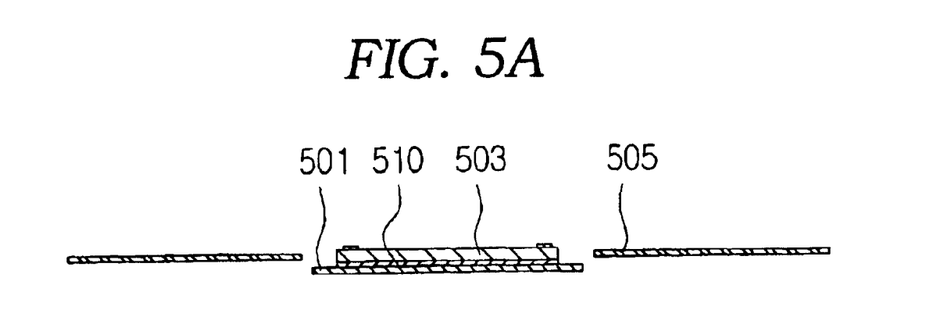
FIGS. 5a to 5e are views schematically showing a process of fabricating a semiconductor package with a heat-radiating canopy molded thereon according to a preferred embodiment of the present invention.

First, as shown in FIG. 5a, a semiconductor chip 503 is attached to a die paddle 501 of a lead frame for fabricating the semiconductor package by means of an adhesive 510 using a die bonding machine. At this time, a substrate in the form of a printed circuit board or a tape may be employed instead of the lead frame. In addition, after the attachment of semiconductor chip 503, the adhesive 510 is cured using an electric oven or a heater block.

Figure 5B:
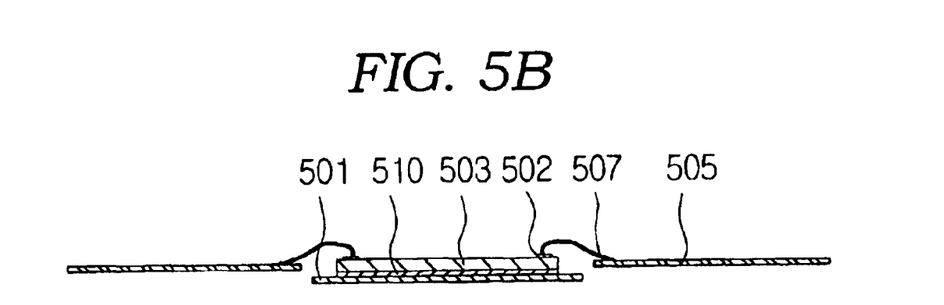

Next, as shown in FIG. 5b, bond pads 502 on the semiconductor chip 503 and inner leads 505 of the lead frame are connected to each other by means of fine gold wires 507 using a wire bonding machine. At this time, conductors for electrically connecting the bond pads 502 and the inner leads 505 may include fine copper wires or fine aluminum wires.

Figure 5C:
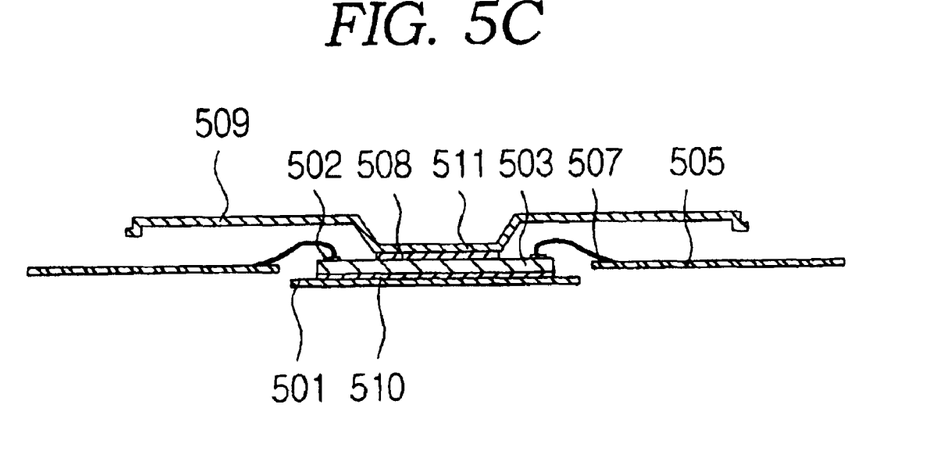

Thereafter, as shown in FIG. 5c, a heat-radiating canopy 509 is attached to a top surface of the semiconductor chip 503 by means of an adhesive 508 using a die-bonding machine or a heat-radiating canopy bonding machine.

At this time, when the head-radiating canopy 509 is attached on the top surface of the semiconductor chip 503, it is more preferred that the heat-radiating canopy be attached to an active area in view of a heat dissipation efficiency.

Further, it is preferred that thermal conductive materials or electrically conductive materials be employed as materials for the heat-radiating canopy 509 in view of the heat dissipation efficiency. For example, it is more preferred that the heat-radiating canopy be made of metal in view of the heat dissipation efficiency. If the heat-radiating canopy is made of metal, there is an advantage in that electrical characteristics of the package in a high frequency band can be significantly improved since the metallic heat-radiating canopy is electrically grounded to reduce inductances of the fine gold wires and the inner leads within the package. In addition, if the die paddle and the heat-radiating canopy are grounded, there is another advantage in that noise can be significantly reduced due to EMI shield effects on the interior and exterior thereof.

Further, the heat-radiating canopy 509 may be constructed in such a manner that a central portion 511 of the heat-radiating canopy 509 is depressed to cause the portion 511 located on the top surface of the semiconductor chip 503 to make a contact with the semiconductor chip 503 and the remaining portions of the heat-radiating canopy not to make a contact with the semiconductor chip 503. At this time, it is more preferred that the depressed portion make a contact with the active area in the semiconductor chip in view of the heat dissipation efficiency.

In addition, the heat-radiating canopy 509 may take a round or polygonal shape. This means that the heat-radiating canopy may be designed to take different shapes depending on the shape of the semiconductor package. Further, a peripheral edge of the heat-radiating canopy 509 may be curved toward the bottom surface of the semiconductor package. Alternatively, the peripheral edge of the heat-radiating canopy 509 may be formed with a protruding portion toward the bottom surface of the semiconductor package. Moreover, as for the adhesive for attaching the heat-radiating canopy, it is possible to selectively use any one of thermo-plastic adhesive epoxy, thermo-set adhesive epoxy, thermal conductive epoxy, electrically conductive epoxy, adhesive tape, and an arbitrary combination thereof.

The adhesive 508 in the lead frame with the heat-radiating canopy 509 attached thereto is cured by using an electric oven or a heater block. In order to further improve the heat dissipation effect, an external heat slug may be attached to the exposed surface of the heat-radiating canopy 509. Alternatively, a plurality of projections may be formed on the exposed top surface of the heat-radiating canopy in order to further increase the heat dissipation effect.

Figure 5D:
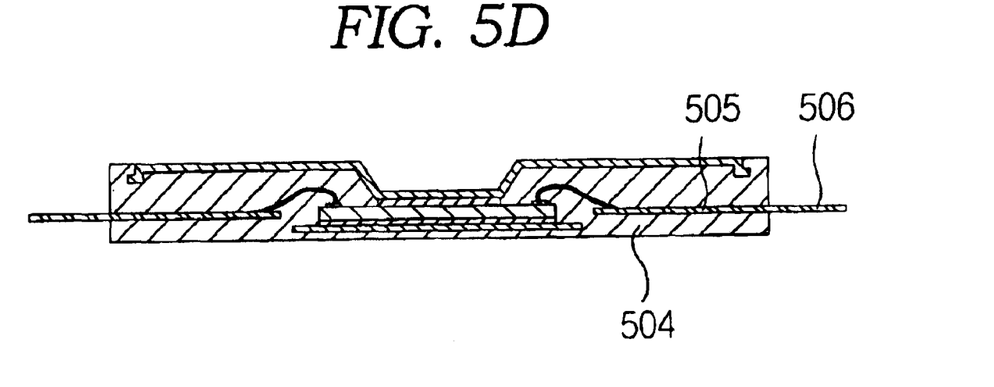

Next, as shown in FIG. 5d, in order to protect the semiconductor chip and the fine gold wires, an epoxy molding process is performed using an epoxy molding compound 504 in a mold die.

At this time, the top surface of the heat-radiating canopy should not be covered with the epoxy molding compound. After the epoxy molding process, a post-mold curing process (a process of further curing the epoxy molding compound after the molding process) is performed using the electric oven. If necessary, an exposed portion of the heat-radiating canopy overmolded with the epoxy molding compound may be polished by means of a polishing process. Alternatively, a defleshing process may be performed instead of the polishing process or at the same time to it. Further, out leads 506 or the heat-radiating canopy may be plated, if necessary. Solder, tin, silver or gold can be used as materials for the plating.

According to this process, there is an advantage in that it is possible to significantly reduce the amount of alpha particles generated from the molding compound and directly infiltrate into circuit portions of the semiconductor chip.

Figure 5E:
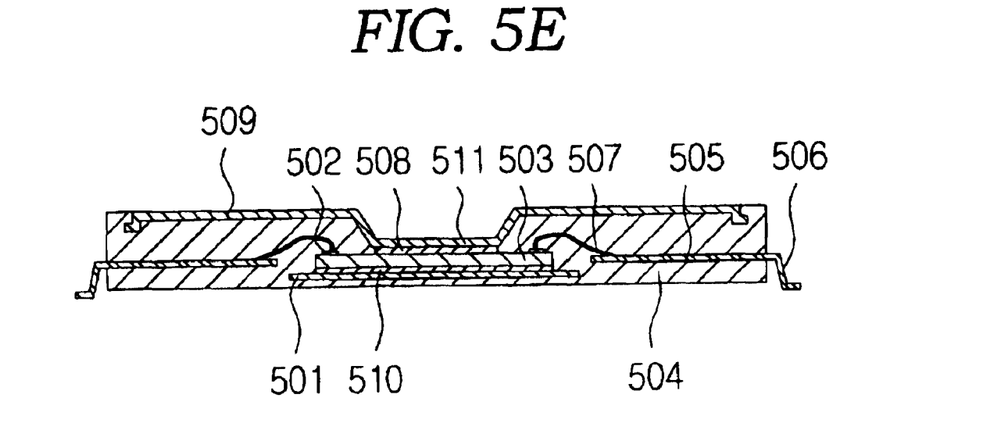

Then, as shown in FIG. 5e, the out leads 506 of a semiconductor package obtained after completion of the epoxy molding process are trimmed and formed by using a die, so that I/O terminals of the semiconductor package are formed.

At this time, in case of a semiconductor package obtained after completion of the epoxy molding process by using the substrate instead of the lead frame, solder balls (616 in FIG. 6) may be attached to the I/O terminals formed at the bottom surface of the substrate. In the semiconductor package fabricated by using the substrate instead of the lead frame, the package can be singularized by means of sawing or cutting.

Meanwhile, the semiconductor package fabricated according to this process can use a lead frame fabricated using a conventional open tool and also utilize conventional equipments in the fabricating process without changing the structure of the lead frame.

Furthermore, as shown in FIG. 5e, the semiconductor package according to the present invention has a structure in which the heat-radiating canopy on the top surface of the package and the die paddle on the bottom surface thereof are generally symmetrical. Thus, there is an advantage in that it is possible to prevent warpage of the semiconductor package due to repeated thermal expansion and contraction thereof and fine delamination between the heat-radiating material and the molding material.

Figure 5F:
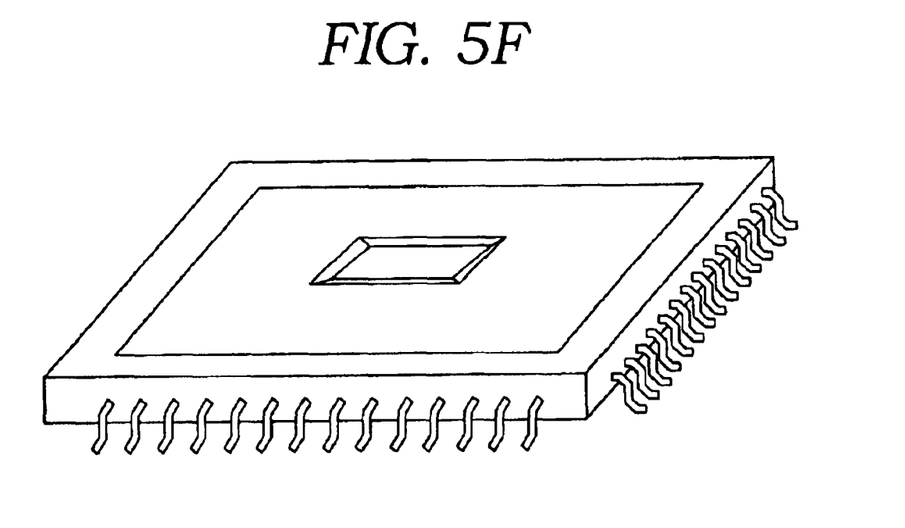
FIG. 5f is a perspective view of the semiconductor package with the heat-radiating canopy molded thereon which is completed through the process shown in FIGS. 5a to 5e.

An external appearance of the semiconductor package with the heat-radiating canopy molded thereon which has been completed through the aforementioned process is shown in FIG. 5f. FIG. 5f shows a state where the central portion of the heat-radiating canopy is depressed and an external heat slug is not attached thereto. As mentioned above, the top surface of the heat-radiating canopy may be formed with a plurality of projections or the external heat slug may be attached to the heat-radiating canopy, in order to further improve the heat dissipation efficiency.

Figure 6:
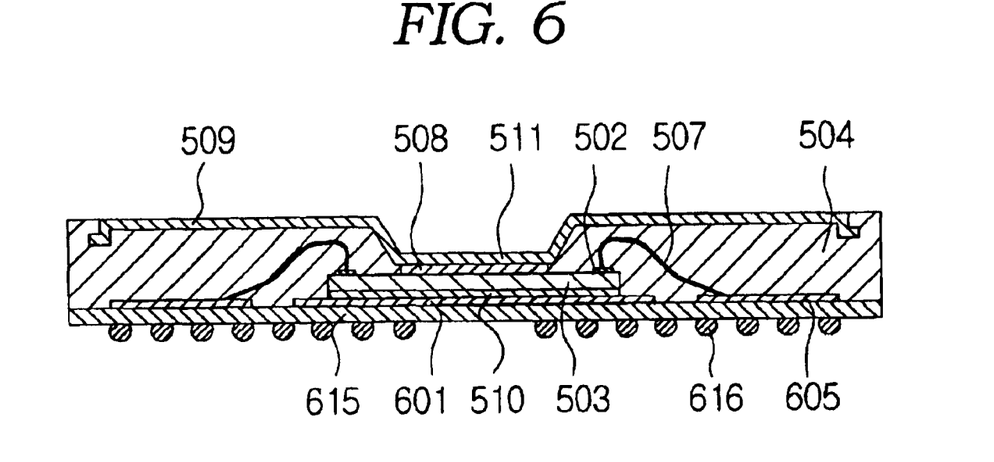
FIG. 6 is a view showing another preferred embodiment of the present invention in which the heat-radiating canopy contemplated in the present invention is applied to a semiconductor package using a substrate.

FIG. 6 is a view showing another preferred embodiment of the present invention in which the heat-radiating canopy contemplated in the present invention is applied to a semiconductor package using a substrate. A detailed description thereof will be made below.

A process of fabricating a semiconductor package shown in FIG. 6 is slightly different from that of the semiconductor package shown in FIGS. 5a to 5e. Therefore, only different portions of the fabrication process will be specifically described below.

First, a step of forming a die paddle 601 and inner leads 605 on a substrate 615 is further included. Then, after a semiconductor chip 503 is attached to the die paddle 601 using the adhesive 510, the bond pads 502 on the semiconductor chip 503 and the inner leads 605 are connected by means of the wires 507.

Thereafter, a heat-radiating canopy 509 is attached on the top surface of the semiconductor chip 503 using a adhesive 508. Subsequently, they are overmolded so that the top surface of the heat-radiating canopy 509 is exposed to the exterior. Then, solder balls are formed on the bottom surface of the semiconductor package obtained after completion of the molding.

It should be noted that various steps of the process described with reference to FIGS. 5a to 5e may be applied to the process of fabricating the semiconductor package shown in FIG. 6.

Although the present invention has been described in connection with the preferred embodiments, the preferred embodiments do not limit the invention but are provided for illustrative purposes only. It will be apparently understood by those skilled in the art that various changes, modifications or adjustments may be made thereto without departing from the technical spirit of the invention. Therefore, the scope of the invention is defined by the appended claims and should be construed as including all of such various changes, modifications or adjustments.

As mentioned above, according to the present invention, there is an advantageous effect in that since a canopy serving as a heat slug made of materials having high thermal conductivities (i.e., metal) is attached to a surface of the semiconductor chip, particularly, in the active area where circuits are arranged, heat can be more efficiently dissipated. Since the exposed area of the heat slug is relatively wider than that in a conventional semiconductor package, the amount of heat dissipation to the exterior can be increased. Further, the heat dissipation efficiency can be further improved by installing the external heat slug on the exposed surface of the heat slug. Further, according to the present invention, high reliability of semiconductor products can be maintained by preventing generation of warpage of the semiconductor package due to repeated thermal expansion and contraction thereof by means of upper and lower stable (symmetric) structures of the material constructing the interior of the package. Further, generation of fine delamination between the metal and the molding material due to the warpage may be prevented. Moreover, if the heat-radiating canopy is formed of metallic materials, the metallic heat-radiating canopy can be electrically grounded to reduce inductances in the fine gold wires and the inner leads within the package, so that electrical characteristics of high frequency products can be improved. In addition, the amount that alpha particles generated from the molding compound and infiltrate directly into the circuit portions of the semiconductor chip can be significantly reduced to prevent malfunction of the semiconductor device. (Since a little amount of alpha particles is emitted from the molding compound used, in the semiconductor package, and it may induce movement of electrons in an IC fabricated by a CMOS process, which may cause malfunction in memory chips. By attaching the heat-radiating canopy to the top surface of the semiconductor package according to the present invention, such infiltration of the alpha particles can be prevented). Further, since the die paddle and the canopy are grounded to obtain the EMI shield effects on the interior and exterior thereof, the noise that may be generated in the semiconductor chip can be significantly reduced. Furthermore, the lead frame used in the semiconductor package fabricated by the conventional open tools can be used as it is, so that the additional costs that may be incurred by modifying the die paddle or attaching a separate expensive heat slug can be avoided. Therefore, the production costs of the semiconductor package fabricated according to the present invention are relatively lower than those of conventional semiconductor packages. Moreover, since it is possible to utilize the conventional fabrication equipments without changing the structure of the lead frame, the workability is stabilized and the productivity of the existing semiconductor plastic package can be maintained.

What is claimed is:

1. A heat dissipation type semiconductor package including a die paddle, a semiconductor chip mounted on the die paddle, and a lead frame, comprising:

a plurality of wires electrically connecting bond pads formed on the semiconductor chip and inner leads in the lead frame;

a heat-radiating canopy attached to a top surface of the semiconductor chip; and molding material surrounding all of the die paddle, the semiconductor chip, the inner leads and a bottom surface of the heat-radiating canopy;

wherein the top surface of the heat-radiating canopy is exposed to the exterior, and a portion of the surface of the heat-radiating canopy being in contact with the semiconductor chip is recessed.

2. The heat dissipation type semiconductor package according to claim 1, wherein the heat-radiating canopy is attached to an active area of the top surface of the semiconductor chip.

3. The heat dissipation type semiconductor package according to claim 2, wherein the heat-radiating canopy has a round shape or a polygonal shape depending on the shape of the semiconductor package.

4. The heat dissipation type semiconductor package according to claim 1, wherein the heat-radiating canopy is made of a material selected from a group consisting of thermal conductive materials, electrically conductive materials and an arbitrary combination thereof.

5. The heat dissipation type semiconductor package according to claim 1, wherein an edge of the heat-radiating canopy is curved toward a bottom surface of the semiconductor package.

6. The heat dissipation type semiconductor package according to claim 1, wherein an edge of the heat-radiating canopy is formed with a portion protruding toward a bottom surface of the semiconductor package.

7. The heat dissipation type semiconductor package according to claim 1, further comprising an external heat slug attached to the exposed top surface of the heat-radiating canopy.

8. The heat dissipation type semiconductor package according to claim 1, wherein the exposed top surface of the heat-radiating canopy is formed with a plurality of projections thereon.

9. The heat dissipation type semiconductor package according to claim 1, wherein the heat-radiating canopy is plated.

10. A heat dissipation type semiconductor package including a substrate, a die paddle formed on the substrate, a semiconductor chip mounted on the die paddle, and inner leads attached to the substrate and serving as electrical contacts, comprising:

a plurality of wires electrically connecting bond pads formed on the semiconductor chip and the inner leads;

a heat-radiating canopy attached to a top surface of the semiconductor chip;

a molding material surrounding all of the die paddle, the semiconductor chip, the inner lead and a bottom surface of the heat-radiating canopy; and solder balls mounted on a bottom surface of the substrate and serving as electrical inputs/outputs;

wherein the top surface of the heat-radiating canopy is exposed to the exterior, and a portion of the surface of the heat-radiating canopy being in contact with the semiconductor chip is recessed.

11. The heat dissipation type semiconductor package according to claim 10, wherein the heat-radiating canopy is attached to an active area in the top surface of the semiconductor chip.

12. The heat dissipation type semiconductor package according to claim 11, wherein the heat-radiating canopy has a round shape or a polygonal shape depending on the shape of the semiconductor package.

13. The heat dissipation type semiconductor package according to claim 10, wherein the heat-radiating canopy is made of a material selected from a group consisting of thermal conductive materials, electrically conductive materials and an arbitrary combination thereof.

14. The heat dissipation type semiconductor package according to claim 10, wherein an edge of the heat-radiating canopy is curved toward a bottom surface of the semiconductor package.

15. The heat dissipation type semiconductor package according to claim 10, wherein an edge of the heat-radiating canopy is formed with a portion protruding toward a bottom surface of the semiconductor package.

16. The heat dissipation type semiconductor package according to claim 10, further comprising an external heat slug attached to the exposed top surface of the heat-radiating canopy.

17. The heat dissipation type semiconductor package according to claim 10, wherein the exposed top surface of the heat-radiating canopy is formed with a plurality of projections thereon.

18. The heat dissipation type semiconductor package according claim 10, wherein the heat-radiating canopy is plated.

19. A method of fabricating a heat dissipation type semiconductor package, comprising the steps of:

attaching a semiconductor chip to a die paddle of a lead frame of a semiconductor package;

connecting bond pads on the semiconductor chip and inner leads in the lead frame by means of wires;

attaching a heat-radiating canopy to a top surface of the semiconductor chip;

performing a molding in such a manner that a top surface of the heat-radiating canopy is exposed to the exterior; and trimming and forming out leads in the semiconductor package obtained after completion of the molding so as to form I/O terminals of the semiconductor package.

20. The method according to claim 19, wherein the semiconductor chip attaching step comprises the step of attaching the semiconductor chip by means of an adhesive and then curing the adhesive using an electric oven or a heater block.

21. The method according to claim 19, wherein the wires are made of any one of gold, copper, aluminum, and an arbitrary combination thereof.

22. The method according to claim 19, wherein a central portion of the heat-radiating canopy is recessed so that a portion of the heat-radiating canopy, which is located above the top surface of the semiconductor chip, is in contact with the semiconductor chip and the remaining portions of the heat-radiating canopy are not in contact with the semiconductor chip.

23. The method according to claim 22, wherein, when the heat-radiating canopy is attached to the top surface of the semiconductor chip, the heat-radiating canopy is caused to be in contact with an active area of the semiconductor chip.

24. The method according to claim 22, wherein the heat-radiating canopy is made of a material selected from a group consisting of thermal conductive materials, electrically conductive materials and an arbitrary combination thereof.

25. The method according to claim 19, wherein the heat-radiating canopy has a round shape or a polygonal shape depending on the shape of the semiconductor package.

26. The method according to claim 19, wherein an edge of the heat-radiating canopy is curved toward a bottom surface of the semiconductor package.

27. The method according to claim 19, wherein an edge of the heat-radiating canopy is formed with a portion protruding toward a bottom surface of the semiconductor package.

28. The method according to claim 19, wherein the heat-radiating canopy attaching step comprises a step of attaching the heat-radiating canopy to the top surface of the semiconductor chip by means of an adhesive and then curing the adhesive using an electric oven or a heater block.

29. The method according to claim 28, wherein the adhesive is selected from a group consisting of thermoplastic adhesive epoxy, thermo-set adhesive epoxy, thermal conductive epoxy, electrically conductive epoxy, an adhesive tape, and an arbitrary combination thereof.

30. The method according to claim 19, further comprising a step of forming a plurality of projections on the exposed surface of the heat-radiating canopy.

31. The method according to claim 19, further comprising a step of attaching an external heat slug to the exposed surface of the heat-radiating canopy.

32. The method according to claim 19, further comprising a step of performing a post-mold curing process using an electric oven, after the molding step.

33. The method according to claim 19, further comprising a step of polishing or defleshing the exposed surface of the heat-radiating canopy.

34. The method according to claim 19, further comprising a step of plating the out leads or the exposed surface of the heat-radiating canopy.

35. A method of fabricating a heat dissipation type semiconductor package, comprising the steps of:
   forming a die paddle and inner leads on a substrate;
   attaching a semiconductor chip to the die paddle;
   connecting bond pads on the semiconductor chip and the inner leads by means of wires;
   attaching a heat-radiating canopy to a top surface of the semiconductor chip by means of an adhesive;
   performing a molding in such a manner that a top surface of the heat-radiating canopy is exposed to the exterior; and
   forming solder balls on a bottom surface of the semiconductor package after completion of the molding step.

36. The method according to claim 35, wherein the semiconductor chip attaching step comprises a step of attaching the semiconductor chip by means of an adhesive and then curing the adhesive using an electric oven or a heater block.

37. The method according to claim 35, wherein the wires are made of any one of gold, copper, aluminum, and an arbitrary combination thereof.

38. The method according to claim 35, wherein a central portion of the heat-radiating canopy is recessed so that a portion of the heat-radiating canopy, which is located above the top surface of the semiconductor chip, is in contact with the semiconductor chip and the remaining portions of the heat-radiating canopy are not in contact with the semiconductor chip.

39. The method according to claim 38, wherein, when the heat-radiating canopy is attached to the top surface of the semiconductor chip, the heat-radiating canopy is caused to be in contact with an active area of the semiconductor chip.

40. The method according to claim 35, wherein the heat-radiating canopy is made of a material selected from a group consisting of thermal conductive materials, electrically conductive materials and an arbitrary combination thereof.

41. The method according to claim 35, wherein the heat-radiating canopy has a round shape or a polygonal shape depending on the shape of the semiconductor package.

42. The method according to claim 35, wherein an edge of the heat-radiating canopy is curved toward a bottom surface of the semiconductor package.

43. The method according to claim 35, wherein an edge of the heat-radiating canopy is formed with a portion protruding toward a bottom surface of the semiconductor package.

44. The method according to claim 35, wherein the heat-radiating canopy attaching step comprises a step of attaching the heat-radiating canopy to the top surface of the semiconductor chip by means of an adhesive and then curing the adhesive using an electric oven or a heater block.

45. The method according to claim 44, wherein the adhesive is selected from a group consisting of thermoplastic adhesive epoxy, thermo-set adhesive epoxy, thermal conductive epoxy, electrically conductive epoxy, an adhesive tape, and an arbitrary combination thereof.

46. The method according to claim 35, further comprising a step of attaching an external heat slug to the exposed surface of the heat-radiating canopy.

47. The method according to claim 35, further comprising a step of performing a post-mold curing process using an electric oven, after the molding step.

48. The method according to claim 35, further comprising a step of polishing or defleshing the exposed surface of the heat-radiating canopy.

49. The method according to claim 35, further comprising a step of plating the out leads or the exposed surface of the heat-radiating canopy.

50. The method according to claim 35, further comprising a step of forming a plurality of projections on the exposed surface of the heat-radiating canopy.

51. A heat dissipation type semiconductor package including dye paddle a semiconductor chip mounted on the die paddle and inner leads serving as electrical contacts, comprising:
   a plurality of wires electrically connecting bond pads formed on the semiconductor chip and inner leads;
   a heat-radiating canopy attached to a top surface of the semiconductor chip; and
   molding material surrounding all of the die paddle, the semiconductor chip, the inner leads and a bottom surface of the heat-radiating canopy;
   wherein the top surface of the heat-radiating canopy is exposed to the exterior, and a portion of the surface of the heat-radiating canopy being in contact with the semiconductor chip is recessed.

* * * * *